United States Patent [19]

Larivé et al.

[11] 4,384,514

[45] May 24, 1983

[54] NIP CONTROL METHOD AND APPARATUS

[75] Inventors: René Larivé, Grand'Mère; Osman J. Walker, Lansdowne, both of Canada

[73] Assignee: Consolidated-Bathurst Inc., Quebec, Canada

[21] Appl. No.: 240,150

[22] Filed: Mar. 3, 1981

[51] Int. Cl.³ .................... B30B 3/04; B30B 15/34
[52] U.S. Cl. .......................... 100/38; 100/47;
    100/93 RP; 100/162 B; 100/917; 29/116 AD;
    219/10.43; 219/10.57; 219/10.71
[58] Field of Search ............... 100/35, 38, 47, 93 RP,
    100/93 P, 168, 917, 162 B; 72/16; 29/116 AD,
    113 AD; 162/206, 252, 305, 198; 219/10.43,
    10.57, 10.71, 10.73, 10.61

[56] References Cited

U.S. PATENT DOCUMENTS

| | | | |
|---|---|---|---|
| 2,981,175 | 4/1961 | Goyette | 100/93 RP |
| 3,177,799 | 4/1965 | Justus et al. | 100/93 RP |
| 3,203,678 | 8/1965 | Sawyer et al. | 100/93 RP |
| 3,456,582 | 7/1969 | McClenathan | 100/917 X |
| 3,702,912 | 11/1972 | Greenberger | 219/10.61 |
| 3,770,578 | 11/1973 | Spurrell | 100/93 RP |
| 4,114,528 | 9/1978 | Walker | 100/47 |

Primary Examiner—Peter Feldman
Attorney, Agent, or Firm—Robert J. Schaap; Eric Fincham

[57] ABSTRACT

This invention provides a method and an apparatus for use in controlling a nip through which material is passed. The apparatus comprises at least one means for generating a magnetic field and means for locating the magnetic field generating means at a selected position along the length of one of the pressing elements, adjacent to the element, to thereby affect only a portion of the length of the element, thus controlling only that portion of the length of the nip which is generally aligned with the affected portion of the pressing element.

16 Claims, 6 Drawing Figures

NIP CONTROL METHOD AND APPARATUS

This invention is directed toward a method and an apparatus for use in controlling the profiles of a nip through which material is passed.

The invention is more particularly directed toward a method and an apparatus for use in controlling a calendar nip through which a web of material such as paper is passed.

It is known that passing material in the form of a strip, sheet or web through a narrow nip formed between co-operating pressing elements, changes the character of the material. For example, a wet web of paper material may be passed through the nip formed between two adjacent rotating rolls to express water therefrom. A dry paper web may also be passed through a calendar nip formed between two rotating rolls to change its properties. In more detail, the calendering of a web of paper and the like is the action involved in subjecting the viscoelastic web to the nip pressure of a set of two or more adjacent and revolving rolls. This action compacts the web and changes its caliper, its density and its surface and optical characteristics by pressure, friction, temperature, and by other physical conditions. The uniformity of the compacting action, or calendering intensity, depends on the uniformity of the nip pressure which depends on the uniformity of the contact between the adjacent rolls and which in turn depends on the local roll diameter. It was found that control of this uniformity could be effected by controlling the local diameter of the roll and thereby controlling the localized nip pressure. As long as these rolls were made of materials whose dimensions would respond to changes in temperature, it was found that one way to control localized roll diameter was to vary the temperature of the localized area. It is known in the prior art to vary the temperature at the localized area of the roll by pressing friction pads against this area of the roll to raise its temperature and thereby increase the local roll diameter. It was also known to direct compressed air against localized areas of the roll to change its temperature and again change the local roll diameter. Another known manner of controlling local roll diameter is to direct jets of hot or cold air against that local area of the roll, the diameter of which is to be controlled.

Many of the prior art methods had certain deficiencies, however. Friction pads tended to wear the roll surfaces and thus defeat the purpose for which they were intended. Modulation using friction pads was also difficult. The magnitude of correction and response through the use of air showers or jets was low because of the low efficiency of heat transfer between the air and the rolls. The cost of the equipment was also fairly high, particularly when automatic control was required.

It is the broad purpose of the present invention to provide a method, and an apparatus, for controlling the temperature and/or pressure profile of a nip formed between co-operating pressing elements which method is simple to use, efficient and easy to control.

In accordance with the present invention it has been discovered that the application of energy from a magnetic field to a local area of the pressing element forming part of the nip, and more particularly, to a roll, can increase its temperature sufficiently to change its size. In the case of a roll, the roll diameter is changed and thereby the nip pressure is controlled.

It is well-known to use magnetic fields for induction heating in the art of melting metals. It is also known to employ induction heating to heat metallic surfaces. It is further known in the plastics art to heat metallic surfaces of calender rolls for the purposes of controlling the overall temperature of a nip. Such an application of heating is shown in U.S. Pat. No. 3,702,912 issued Nov. 14, 1972 to Joseph Irwin Greenburg. In this patent, induction heating is applied across the entire length of the roll in that area where the nylon web contacts the roll for the purpose of heating the surface of the roll to thereby heat the web of nylon passing over it and thus control the temperature of the web during the calendering operation. However there is no teaching of controlling the temperature profile.

Applicant has discovered that localized induction heating can be applied to a local area of a nip-forming roll to heat the roll area to such a temperature that the diameter of the roll in the local area is substantially affected to thereby affect the nip pressure. Means for generating a magnetic field can be positioned adjacent the local area of the roll to heat this roll area by induction and thus change the diameter of the roll. The magnetic field generating means can be moved along the length of the roll to different positions as desired, depending on which local area of the roll is to be heated. Preferably, however, a plurality of magnetic field generating means are provided along the length of the roll and adjacent the roll. Each generating means can be individually controlled. Thus each area or transverse segment of the roll adjacent each generating means can have its temperature varied generally independently of the temperature of the adjacent areas of the roll and thus the nip pressure across the entire length of the roll can be controlled through the independent operation of the individual generating means. The degree of control can be dictated by the number of generating means employed across the length of the roll and/or also by the power range of each generating means. Each generating means can be controlled in a simple off-on manner or, alternatively, by a modulating control circuit which can vary the amount of power delivered to the generating means.

In situations where the nip parameter is not pressure, but rather temperature, then the present invention can also be used to control the transverse temperature profile along the nip in the manner disclosed above for controlling the transverse pressure profile.

It will be seen that the use of the magnetic field generating means to vary the temperature of the roll at localized areas across the length of the roll overcomes many of the deficiencies of the prior art. For example, the magnetic field generating means do not touch the roll surface while heating it and therefore there is no roll wear. The generating means are very efficient in heating the roll to the desired temperature in order to change its diameter as compared to the heating of the roll by directing streams of hot air against it. This system is simple, having few moving parts and is relatively inexpensive to manufacture and to install on existing equipment. In addition, the system can control the temperature very easily, either manually or automatically.

In being able to control the transverse pressure and/or temperature profile of any nip in any pressing or calendering operation many of the physical properties of the web, sheet or strip product being pressed or calendered can therefore also be controlled. Moreover, in controlling the pressure related properties of a product, applicant has discovered that he can at the same time in some cases, control temperature related properties of the product being worked. Thus, while a plurality of magnetic field generating means may be employed to provide different areas of a roll across its length with different temperatures depending upon the nip pressure requirements for controlling the transverse property profile, and additional equal increment of power can be applied to each magnetic field generating unit to raise the temperature of each local area of roll by the same amount to thereby change the average value of one or more of the heat affected properties of the web or other product. In some applications, other properties may be simultaneously controlled while controlling the transverse profile of the pressure related properties of the web or other product. Where temperature properties are involved, the invention can also be used to control the average transverse value of heat controlled properties simultaneously with the control of the pressure transverse profile of heat related properties.

Thus, in its broadest aspect the invention is directed towards a method for use in controlling the transverse profile of one or two operating parameters of the nip formed between two co-operating pressing elements. The method comprises locating means for generating a magnetic field adjacent to one of the elements at at least one transverse segment along the length of the element. The magnetic field generating means is then operated to substantially affect only a portion of the length of the pressing element and to thus control only that portion of the length of the nip generally aligned with the affected portion of the pressing element.

The invention is also directed toward an apparatus for carrying out the above method which apparatus comprises at least one means for generating a magnetic field and means for locating the magnetic field generating means adjacent to at least one transverse segment along the length of one of the pressing elements and adjacent to the element to thereby affect only that transverse segment of the element when the generating means is operated. This results in controlling only that portion of the length of the nip which is generally aligned with the affected portion of the element. In the situation where a material or product is being passed through or processed by the nip, the invention can be used to control the transverse profile of those physical properties of the material or product which are influenced by any one of the above nip parameters.

The co-operating material pressing elements preferably comprise two rotating rolls which form the nip between them. Each magnetic field generating means is mounted adjacent to one of the rolls and if desired can be moved along a line parallel to the axis of the roll to any selected position along the length of the roll. Preferably, however, a plurality of magnetic field generating means are provided along the length of the roll, each means affecting only a transverse segment of the roll length, the sum of the lengths of each segment at least equaling the width of the product being worked. Individual control means are provided for each generating means whereby each generating means can independently control a local area or transverse segment of the roll. If desired, the properties of the web which are to be controlled can be measured at locations transversely across the web and these measurements can be employed to proportionately control the magnetic field generating means to obtain the desired properties in the web.

The invention will now be described in detail having reference to the accompanying drawings wherein.

Figure 1:
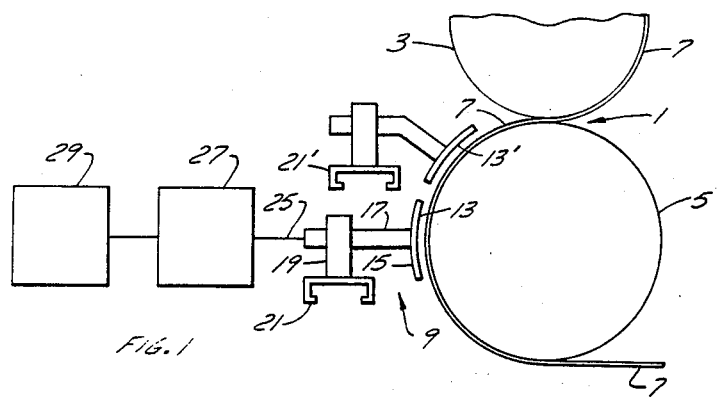
FIG. 1 is an elevation view showing the installation of the magnetic field generating means on a calender.
Figure 2:
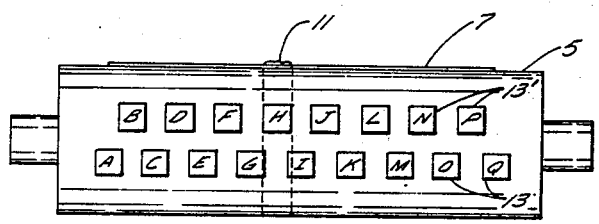
FIG. 2 is a front elevation view of a calender roll showing schematically the arrangement of the magnetic field generating means in relation to the roll surface.
Figure 3:
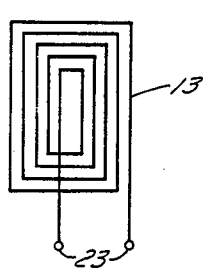
FIG. 3 is a front view of the induction coil used to generate the magnetic field.

The invention can be used in controlling any nip formed between two co-operating pressing elements. As shown in FIG. 1, the nip 1 can be formed between two rotating rolls 3, 5. A sheet or web 7 of paper is drawn about roll 5 and through the nip 1 formed between rolls 3 and 5 by suitable means (not shown). In the nip 1, the web 7 is subjected to pressure to change certain properties of the web. At least one magnetic field generating means 9 is mounted adjacent the surface of roll 5 to affect the local area or section 11 of the roll along its length as seen in FIG. 2. The magnetic field generating means 9 includes an induction coil 13 which can be mounted on a suitable support 15. The construction of such coils are well known. Preferably the coil is wound in a rectangular pattern as shown in FIG. 3 and the support 15 on which the coil 13 is mounted, can be curved as shown in FIG. 1 to generally follow the curvature of the roll. The actual size of the coil 13 facing the roll 5 will depend on the diameter of the roll, the fineness of control desired, the particular application, etc. In general, the curved dimension of the coil 13 would be a relatively small fraction of the circumference of the roll 5. In a calendering-of-newsprint application, involving a 32" diameter king roll, the following coil dimensions were used: 10" curved long side by 8" straight short side.

The support 15 for the coil is preferably fixedly mounted on an arm 17 which extends from the center of the rear convex surface of the support 15. The arm 17 can be slidably mounted in a post 19. The post 19 in turn can be slidably mounted on a support bar 21 which support bar extends across the face of the roll 5 parallel to the axis of the roll 5. It will be seen that the coil 13 can be positioned toward or away from the roll 5 by moving the arm 17 in the post 19. Once the desired position for the coil 13, relative to its spacing from the surface of roll 5 has been obtained, the arm 17 can be locked in the post 19 by suitable means. In addition, the post 19 can be moved along the support bar 21 to position the coil 13 adjacent any selected area or section of the roll along its length against which area or section a magnetic field is to be directed by the coil 13, when operative, so as to heat this area and thereby change the diameter of the roll at this area to affect the nip pressure. Once the desired longitudinal position of the coil 13 has been obtained relative to the roll, the post 19 can be locked in place on the support bar 21. The ends 23 of the coil 13 are connected by a lead 25 to a control device 27 located adjacent the rolls 3, 5. A power source 29 provides power to the coil 13, through control device 27, to generate a magnetic field. In an alternative embodiment, the post 19 can be fixed to support bar 21 and means can instead be provided to move the support bar 21 across the face of roll 5, in a direction parallel to the axis of the roll, to locate the coil 13 at the desired position.

While the system has been described using a single induction coil 13 it is preferred to use a plurality of such coils spaced along the length of the roll 5. A plurality of coils, each similar to coil 13, can be mounted on support bar 21. Each coil 13 will control a section of the length of roll 5 opposite it to thereby control a length of the nip transversed by this section. The sum of the lengths of the sections controlled will at least equal the width of the web to be worked. Individual control means 27 can be provided for each coil with a single power means 29. For a finer control, a second support bar 21' can be provided spaced from the first support bar 21 with a plurality of coils 13' mounted on the second bar 21' as well. The coils 13 on the first bar 21 are spaced apart slightly from one another. The coils 13' on the second bar 21' are located between adjacent ones of the coils 13 on the first bar 21 so as to cover the gaps between the coils on the first bar and thus have a coil controlling each cylindrical area of the roll. Preferably, each area or section controlled by any coil 13, 13' overlaps each adjacent area or section by approximately twenty percent of the width of each section.

In operation, once the coils 13, 13' have been located at the desired areas or sections of the roll, the control device 27 for each coil is operated to provide power to the coil to have it generate a magnetic field which can penetrate as deep as possible into the section of the roll opposite the coil as the roll rotates past the face of the coil. The magnetic field heats a localized cylindrical area or section of the roll to a sufficient degree to cause its diameter to increase thereby affecting the nip pressure at the area of the nip traversed by each section.

The need to place the coils "13" or "13'" in close proximity to roll "5" to effect efficient power transfer can lead to damage when the web breaks during normal operation, or when the web is being threaded through after a break. Sometimes paper wraps around the calender roll a sufficient number of times that it can contact the coil. The coil and its support can also be damaged by flying slabs of paper thrown off from any roller when clearing the stack after such a wraparound. The higher the speed the greater the forces and the greater the risk of damage. There are then circumstances when some kind of protection for the coil assembly must be provided, either in the form of a protective shield or by provision of means of retracting the coil to prevent lodgement of web material between the coil and the roll.

Applicants favour an electromechanical system which retracts the coil and shuts off the power. It is triggered by sensing a lateral (i.e. up or down) force on the coil or it may be operated manually.

AC current is preferably provided to each induction coil from the power source 29 at a frequency ranging from between 1000 to 10000 Hertz. This frequency range is a compromise between obtaining the most efficient use of the power delivered to the induction coil and the depth to which the roll can be heated. In general the lower the frequency, the deeper the penetration of the magnetic field into the roll. However, the lower the frequency, the lower the efficiency of energy transferred to the roll. A further consideration in selecting the desired frequency range of operation is the fact that the coreless coils which are preferred for this type of application are generally more effective at higher frequencies. The use of higher frequencies, however, are also limited by the availability of relatively inexpensive electronic elements to be employed in the system. Thus while the present invention can use frequencies ranging from 0 to several 100,000 Hertz, the preferred range is that between 1000 and 10,000 Hertz. At these frequencies, heat penetration of the roll will occur essentially by conduction. Any suitable voltage can be chosen depending on the application, safety considerations and cost. By way of example, a voltage of 400 volts is used for an application involving the calendering of a web of newsprint. The generator 29 will supply the power to the control circuit 27 at the desired voltage and frequency.

Figure 4:
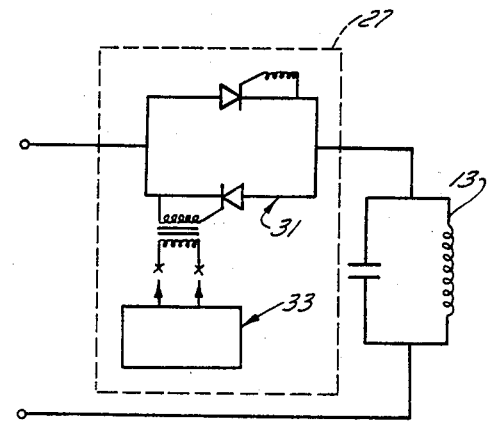
FIG. 4 is a schematic view of the electrical circuit employed.

The control circuit 27 can apply an on-off method for controlling the delivery of power to the coil 13. The method uses a silicon controlled rectifier 31 as shown in FIG. 4. A timer 33 controls the operation of the silicon controlled rectifier 31 to provide power to the induction coil 13 at regular intervals as determined by the operation of the timer. Other well known methods for controlling application of power to the coil 13 can be used instead including a modulating-type circuit. The timer 33 itself can be controlled manually by an operator attending to the calendering operation, or automatically by electronic means operatively connected with sensing devices measuring a property of the web that is to be controlled by the nip. Two properties of the web which can be particularly well controlled by induction heating are caliper and reel hardness. These properties can be controlled by closed loop technology of the type disclosed in Canadian Pat. No. 1,013,836 issued July 12, 1977. Other suitable technology for controlling reel hardness which can be employed with induction heating is disclosed by way of example in Canadian Pat. No. 938,125 issued Dec. 11, 1973 and in U.S. Pat. No. 3,822,588 issued July 9, 1974.

In certain cases, it may be desirable to insulate the cylindrical areas or sections of the roll controlled by each coil from adjacent areas or sections. If the cylindrical areas or sections were insulated from one another this would localize the heating effect and the resultant diameter change. Insulation would also minimize any tendency for the overall temperature of the roll to increase to undesirable levels. Any undesirable temperature rise in the roll could also be controlled by using roll exterior air cooling or roll interior liquid cooling systems. In general, however, the insulating and/or cooling addition should not be necessary as the web itself in many applications will have a cooling effect on the roll being heated. In addition, as will be described, the overall heating of the roll may be desirable in some cases to control other properties of the web simultaneously with the control of pressure related properties of the web.

In the present invention, the subject of electrical frequency and even the method of heating the roll is an interesting one. Since a magnetic field is being directed at a rotating roll, the required induction heating could, under the right conditions, be generated by supply coil 13 using direct current (i.e. at a frequency of zero Hertz) or simply by a permanent magnet and directing the energy of the coil or magnet at a suitable roll rotating at the proper speed. The movement or rotation of the roll generates the required frequency and current to heat the roll. In the case of the coil using direct current the energy could be varied by varying the power to the coil (using modulation or an on-off sequence). For the case of the permanent magnet the energy could be varied by varying the distance of the magnet from the roll. However, the state-of-the-art and other considerations favoured the use of an alternating-current generator in place of a permanent magnet or direct current generator.

The use of the present invention to control the caliper or thickness of the web, and/or the hardness of the reel (formed by winding the paper web into a roll or reel right after it has been calendered), by controlling the nip pressure, will now be described.

Figure 5:
FIG. 5 illustrates the transverse profile of one property of a web being calendered in the relation of the magnetic field generating means to this profile.

Assume a web/sheet of paper passing through a calender nip and producing a caliper or reel hardness profile as shown in FIG. 5. Prior to the present invention the operator, or a computer, would apply cool air to the area of the calendar roll where the web was thin or the reel soft and remove or lessen the cool air from the area where the web was thick or the reel hard. Alternatively, or in addition, the operator could remove or apply a friction pad from or to those areas.

However, with the apparatus described in the present invention, the operator or the automatic system would instead increase or decrease the electrical power to the particular induction coil 13 covering the area on the calender roll that corresponded to the hard or soft spot, thick or thin web. The amount of power applied to the coil would be proportional to, and determined by, the magnitude of the property relative to the average value and/or the desired value of the property being measured and controlled. There is much prior art on controller designs and one such design, by way of example, which could be used in the present case is described in the above mentioned Canadian Pat. No. 1,013,836.

FIG. 5 shows a typical reel hardness or caliper profile. The various induction coils corresponding to those calendering areas responsible for producing the profile are represented by letters. In the situation shown, the operator or computer would increase the electrical power to coils D, E and K, L in proportion to the divergence of the property value (i. e. of the curve) from the average value (the mid-straight line) in order to eliminate the hard spot or thicker caliper. Shortly these "bumps" on the profile curve would disappear, leaving a more uniform reel or flatter web. Similarly, the power to coils A; G, H, I and J; and N, O, P would be decreased in order to correct for the soft spots or thin caliper in these areas. Eventually, by continually correcting for these divergencies a uniform reel or a paper of uniform caliper would be produced.

Because of the magnitude of the heating effect and the rapidity at which the calender roll can be modified, the generating means can be used to correct many upsets in the calendering operation. For example, in order to manufacture different grades of paper on a given paper machine, it is often necessary to increase or reduce the number of calender rolls in the calender stack. On the other hand the King or bottom roll in the calender stack has been ground with a particular crown to support a particular number of calender rolls above it. Changing these rolls means the nip pressure between the King roll and the second last roll will be uneven. It was therefore sometimes necessary to change the King roll or add friction pads. However, by using the present invention on the King roll the operator will now be able to adjust his King roll to give a uniform nip pressure without having to change the roll or use friction pads.

It is thus readily apparent that the present invention can be used in many applications where it is necessary to adjust the profile of the nip pressure and/or pressing intensity between two rolls, so that the pressing function of these rolls can be made more uniform or changed so that a given property of the web passing between these rolls can be made more uniform in the cross direction or at least follow the desired pattern. Examples of such properties have already been given such as caliper and reel hardness. Other properties which can be controlled include smoothness, porosity, printability, opacity, moisture content, density, bulk, etc.

In general when the pressing operation is used in connection with such properties as caliper, reel hardness, smoothness, porosity, printability, opacity, density, bulk, etc. it is usually referred to as a calendering operation. However, when it is used in removing fluids from a web material, it is usually referred to as a wet pressing operation. In many wet pressing operations involving water as the fluid, as is the case for papermaking, most press rolls are made of materials not influenced by magnetic fields. Thus, in applying the present invention to the control of the moisture content profile of the wet web, it will be necessary that the press rolls be modified or changed so that the required control of the nip pressure profile can be achieved according to above disclosure. This change should be a relatively easy one since most calendering operations use rolls made of suitable materials and this technology is applicable to both types of pressing operations. Thus, the rolls would be of an electrically conductive material and in many instances, a magnetic material. Preferably, the rolls are of a composition which responds quickly to induction heating and expands or contracts easily with small changes in temperatures. The surface of the roll should, of course, be of a material or composition that lends itself to a good pressing as is known in the art.

Applicants have disclosed a method and apparatus for controlling the transverse profile of one or more properties of a web material where that property is sensitive to the varying local levels of nip pressure. The method is normally applied independently of the heat level of the overall pressing/calendering operation. However, since the method is dependent on the use of heat to effect control, the same method and apparatus could also be used to control the average level of the property in question where this property or properties are themselves sensitive to the heat level of the pressing-/calendering operation.

Thus, for situations where the property is sensitive to both pressure and heat, the present method and apparatus can be used for simultaneously controlling the transverse profile of that property which is dependent on pressure as well as an average transverse value of the property itself which is dependent on the temperature. Whether or not such an application is done will depend to some extent on the economics of the situation. For example, to control only the transverse profile of the property it may be that the cost of the equipment and the power may be very reasonable, but the cost might be unreasonable if very powerful induction coils and more expensive generators and control equipment had to be installed in order to transmit enough power/energy to the pressing/calendering operation so as to raise the overall surface heating to the desired level. However, as one alternative to the above situation when economics is critical, the bulk of the heat load could be provided by other conventional less expensive methods, e.g. steam and/or hot water heating, etc. and the final heat control load could be supplied via the induction heating method of the present invention.

Thus, where the material properties being treated are both nip pressure and heat sensitive, and where it is economical to control both the transverse profile and the heat level of the pressing operation simultaneously, the coils raise the heat level of the pressing operation to the desired point, plus transfer further energy to the roll 5 in order to control the transverse profile as well as raise the heat level a controllable amount above the nominal level or raise it within the desired controllable range required for that particular property.

In papermaking, most of the paper properties are heat sensitive to some degree or other, but for certain grades, surface properties such as smoothness, gloss, roughness, etc., are more heat sensitive than others. Difficulties arise, however, because some properties react in opposite ways to changes in the heat level. For example, while raising the heat level might increase the gloss, it simultaneously decreases the caliper, and the latter change in some cases could be undesirable.

Figure 6:
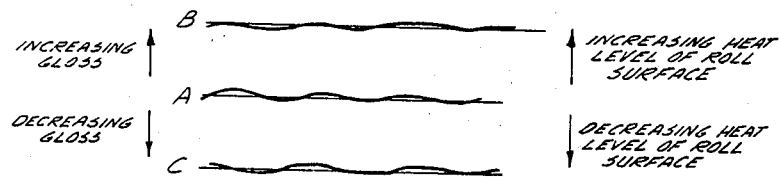
FIG. 6 illustrates the transverse profile and the average transverse value of one property of a web which can be controlled by way of example.

Referring to FIG. 6, applicant illustrates the case where all the coils 13 are operating at approximately 50% of their capacity to raise the heat level to the point where the gloss or smoothness of the paper has reached an average transverse value of A. In the situation where an on-off mode of control is used, the coils 13 would be on or off on an average basis for 50% of the time interval used to maintain control. It is to be noted, of course, that each individual coil could be operating at more or less than the 50% level depending on which coils were being used to control and obtain the pressure sensitive transverse profile shown. Then where it was desired to raise the gloss of the paper to an average value B, the average power input to the coils would be increased to a level where they would all be operating at 60% of their capacity. Similarly, to obtain an average value C, the power input would be decreased to an average level of 40%. At each of these levels the individual coils would still be operating independently to maintain the desired transverse profile of the pressure-sensitive or temperature sensitive property being controlled.

Thus, conceivably, depending on the interaction between any two properties and the accuracy desired, it would be possible to use the coils to control the heat level to thereby control the average transverse value of one given property and at the same time use the same coils to control the transverse profile of another given property of the product being subjected to the pressing operation.

The following are examples of the simultaneous control of various paper properties which are influenced by both nip pressure and heat level of the pressing/calendering operation:

(a) control of the average transverse value of the caliper of the paper simultaneously as the transverse profile of the caliper.

(b) control of the average transverse value of the gloss or smoothness of the paper simultaneously as the transverse profile of the gloss or smoothness.

(c) control of the average transverse value of the gloss of the paper simultaneously as the transverse profile of the caliper.

(d) control of the average transverse value of the dryness or wetness of the web simultaneously as the transverse profile of the dryness or wetness.

(e) control of the average transverse value of the adhesiveness of the web to the roll simultaneously as the transverse profile of the wetness of the web.

While the above examples have been concerned with the nip pressures between two adjacent rotating rolls, the present invention is also applicable to nip pressures between a rotating roll and a flat surface or belt as long as the roll can respond to the influence of induction heating as described above. In most such cases, the flat surface would be a moving one. However, in other applications a non-moving flat (or roll) surface could be necessary to impart certain surface properties to the web. In still other cases, sufficient lubrication may be present to allow one such surface to remain stationary.

In the somewhat rarer case where the two pressing elements are stationary, the present invention could still be used but it would be limited to using alternating current as a source of energy. That is, a permanent magnet could not be used in place of the electro-magnetic coil, and where a coil was used, direct-current could not be used.

While the above has emphasized the use of the present invention in papermaking operations such as paper calendering and wet pressing, it is obvious that the invention can be used in many other pressing/calendering operations in other fields such as in the plastic industry where the calendering of plastic webs or sheets is an important step in the overall processing operations. Similarly, it could also be used in the metal industry where large sheets of molten or hot material are calendered or press rolled.

Furthermore, the invention is capable of being used in instances where no material is passing between rolls. For example, one may have the situation involving the grinding of a metallic roll by a corresponding roll having an abrasive surface pressed against it and rotating at a different speed. If the abrasive roll has a flat crown or profile, the metallic roll will eventually assume a similar profile. On the other hand, if it is desired that the profile or crown of the metal roll be varied, then the present invention can be used to control the pressure profile of the nip between the two rolls and thereby change the profile of the metal roll. In such a situation, the coils shown in FIG. 2 can be applied to the metal roll and the operation of the invention would be similar to that described above. The temperature and corresponding pressures would of course be increased gradually at the proper segments by a suitable computerized program so that the grinding would be gradual.

It will be understood that the above described embodiments are for purposes of illustration only and that changes and modifications may be made thereto without departing from the spirit and scope of the invention.

We claim:

1. A method for controlling a desired physical property of a product involving a web material subjected to a roll pressing operation, wherein said property is controlled by said operation, the method comprising the steps of: passing said web material through a nip formed by two co-operating pressing elements, where at least one of said elements is a rotating roll and where at least a portion of said roll is made of a material which will allow the local diameter of any transverse segment of said roll to change in dimension and thereby change the nip pressure associated with said segment when energy in the form of a magnetic field is directed at said segment; producing and directing said energy to at least one of said transverse segments of said roll so that the nip pressure between said roll segment and the other said co-operating element will change in response to changes in said energy thereby effecting changes in said roll pressing operation; taking a measurement of said physical property; generating an electrical signal proportional to said property measurement; taking said signal and using it to control said changes in said energy so that said physical property will be controlled by said changes in said roll pressing operation.

2. The method of claim 1 wherein said method is applied to a plurality of said transverse segments of said roll and to a plurality of said measurements taken transversely of said web material so that the transverse profile of said physical property of said web can be controlled by said signals.

3. The method of claim 2 wherein the said roll pressing operation and said desired property is influenced by the heat level of said operation in addition to the local nip pressure so that when additional amounts of said energy is directed at said roll the heat level of said segments will change in response to changes in said additional energy thereby effecting further changes in said roll pressing operation and allowing the average transverse value of said property to be controlled simultaneously with the said transverse profile of said property.

4. The method of claim 2 wherein the said roll pressing operation and a property of said web material other than said property is influenced by the heat level of said operation in addition to the local nip pressure so that when additional amounts of said energy are directed at said roll the heat level of said segments will change in response to changes in said additional energy thereby effecting further changes in said roll pressing operation and allowing the average transverse value of said other property to be controlled simultaneously with the said transverse profile of said property.

5. An apparatus for controlling a desired physical property of a product involving a web material subjected to a roll pressing operation wherein the property is controlled by such an operation comprising means for passing said web material through a nip and means for forming said nip which nip is formed by two co-operating pressing elements where at least one of said elements is a rotating roll and where at least a portion of said roll is made of a material which will allow the local diameter of any transverse segment of said roll to change in dimension and thereby change the nip pressure associated with said segment when energy in the form of a magnetic field is directed at said segment; means for producing and directing said energy to at least one of said transverse segments of said roll so that said nip pressure between said roll segment and the other said co-operating element will change in response to changes in said energy thereby effecting changes in said roll pressing operation; means for taking a measurement of said desired physical property; means for generating an electrical signal proportional to said property measurement; means for taking said signal and using it to control said changes in said energy so that said physical property will be controlled by said changes in said roll pressing operation.

6. An apparatus of claim 5 wherein said apparatus includes a plurality of said transverse segments and a plurality of means for directing said energy at said segments and a means for generating a plurality of signals proportional to a plurality of measurements of said physical property so that the transverse profile of said physical property of said web can be controlled by said signals.

7. An apparatus of claim 5 wherein each of said pressing elements is a rotating roll.

8. The apparatus of claim 6 wherein the said roll pressing operation and said desired property is influenced by the heat level of said operation in addition to the local nip pressure and said apparatus includes means for directing additional amounts of energy at said roll so that the heat level of said segments will change in response to changes in said additional energy thereby effecting further changes in said roll pressing operation and allowing the average transverse value of said property to be controlled simultaneously with the said transverse profile of said property.

9. The apparatus of claim 6 further including means for protecting said magnetic field generating means.

10. Apparatus for treating a web of material comprising two co-operating rotating rolls forming a nip, means for passing the web of material through the nip, a plurality of means for selectively generating a magnetic field, said generating means being divided into two rows adjacent each other and being located along selected positions adjacent the roll, the generating means in one row staggered with respect to the generating means in the other row, means for controlling each magnetic field generating means independently of the other means, such that when the generating means are operated, they control only that portion of the length of the nip generally aligned with the affected portion of the roll.

11. Apparatus for treating a web of material comprising two co-operating rotating rolls forming a nip, means for passing the web of material through the nip, at least one means for generating a magnetic field, and means for locating the magnetic field generating means at a selected position along the length of one of the rolls and adjacent to the roll to affect only a portion of the length of the roll when the generating means is operated whereby to control only that portion of the length of the nip generally aligned with the affected portion of the roll, the locating means comprising supporting means adjacent the roll and over the length of the roll, mounting means provided for mounting the magnetic field generating means on the support means, said mounting means being slidably mounted on the support means for movement along the length of the roll.

12. An apparatus as claimed in claim 11 wherein the generating means is slidably mounted on the mounting means for movement toward or away from the surface of the roll.

13. An apparatus as claimed in claim 11 wherein the mounting means is fixed to the support means and the support means are moveably mounted for movement in a direction parallel to the axis of the roll.

14. An apparatus as claimed in claim 10 including means to sense values of a property of the paper sheet controlled by the nip pressure and means connected between the sensing means and the magnetic field generating means to operate the magnetic field generating means in accordance with the values sensed.

15. An apparatus as claimed in claim 14 including additional sensing means to detect values of a property of a web of paper controlled by the temperature of the paper and means connecting the second sensing means with the magnetic field generating means to operate all of the magnetic field generating means uniformly in accordance with the heat sensitive property values sensed.

16. A method for controlling a desired physical property of a product involving a web material subject to a roll-pressing operation wherein said property is controlled by said operation, the method comprising the steps of passing said web material through a nip formed by two co-operating pressing elements where at least one of said elements is a rotating roll and where at least a portion of said roll is made of a material which will allow the local diameter of any transverse segment of said roll to heat up and to change in dimension and thereby change the local nip pressure associated with said segment when energy in the form of a magnetic field is directed to said segment, producing and directing said energy to at least one of said transverse segments of said roll so that the nip pressure between said roll segment and the other said co-operating element will change in response to changes in said energy thereby effecting changes in said roll-pressing operation, taking a measurement of said physical property, taking said measurement and using it to control the said changes in said energy so that the physical property will be controlled by said changes in said roll-pressing operation.

* * * * *

REEXAMINATION CERTIFICATE (1110th)
United States Patent [19]
Larivé et al.

[11] B1 4,384,514
[45] Certificate Issued Aug. 1, 1989

[54] NIP CONTROL METHOD AND APPARATUS

[75] Inventors: René Larivé, Grand'Mère; Osman J. Walker, Lansdowne, both of Canada

[73] Assignee: Consolidated-Bathurst Inc., West Montreal, Canada

Reexamination Request:
No. 90/001,442, Feb. 19, 1988

Reexamination Certificate for:
Patent No.: 4,384,514
Issued: May 24, 1983
Appl. No.: 240,150
Filed: Mar. 3, 1981

[51] Int. Cl.⁴ .................... B30B 3/04; B30B 15/34
[52] U.S. Cl. .................................. 100/38; 100/47; 100/93 RP; 100/162 B; 100/917; 29/116.2; 219/10.43; 219/10.57; 219/10.71

[56] References Cited

U.S. PATENT DOCUMENTS

| | | |
|---|---|---|
| 1,568,892 | 1/1926 | Fox . |
| 1,638,626 | 8/1927 | Fox . |
| 2,761,941 | 9/1956 | Ardichvili . |
| 2,981,175 | 4/1961 | Goyette .................... 100/93 RP |
| 3,006,225 | 10/1961 | Mamas . |
| 3,016,460 | 1/1962 | Andresen . |
| 3,177,799 | 4/1965 | Justus et al. .................... 100/93 RP |
| 3,190,212 | 6/1965 | Moore . |
| 3,203,678 | 8/1965 | Sawyer et al. ................. 100/93 RP |
| 3,213,655 | 10/1965 | Reid . |
| 3,266,561 | 8/1966 | Beachler . |
| 3,456,582 | 7/1969 | McClenathan . |
| 3,508,035 | 4/1970 | Worthley . |
| 3,552,203 | 1/1971 | Freeh . |
| 3,610,897 | 10/1971 | Gerhard . |
| 3,702,912 | 11/1972 | Greenberger . |
| 3,770,578 | 11/1973 | Spurrell ......................... 100/93 RP |
| 4,114,528 | 9/1978 | Walker ................................ 100/47 |

Primary Examiner—Peter Feldman

[57] ABSTRACT

This invention provides a method and an apparatus for use in controlling a nip through which material is passed. The apparatus comprises at least one means for generating a magnetic field and means for locating the magnetic field generating means at a selected position along the length of one of the pressing elements, adjacent to the element, to thereby affect only a portion of the length of the element, thus controlling only that portion of the length of the nip which is generally aligned with the affected portion of the pressing element.

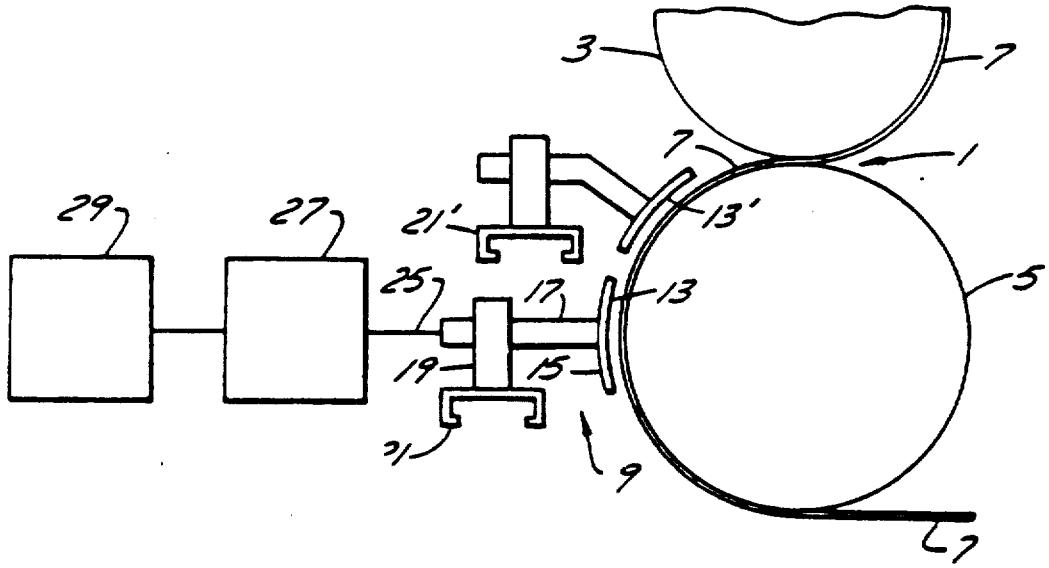

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2, 5–8, 10, 11, 15 and 16 are cancelled.

Claims 1, 3, 4, 9, and 12–14 are determined to be patentable as amended.

New claims 17–19 are added and determined to be patentable.

1. *In a* [A] method for controlling *the entire transverse profile of at least one* [a] desired physical property of [a product involving] a web *of paper* material *which is* subjected to a roll pressing operation, *and* wherein said property is controlled by said operation, *and wherein said web of material is subsequently wound into a reel,* the *improved* method comprising the steps of: passing said web material through a nip formed by two co-operating pressing elements, where at least one of said elements is a rotating roll *having a plurality of transverse segments* and where at least a portion of said roll is made of a material which will allow the local diameter of any transverse segment of said roll to change in dimension and thereby change the nip pressure associated with said segment when energy in the form of a magnetic field is directed at said segment; *providing means for directing said energy to a sufficient number of said segments such that the sum of the lengths of the segments equals said portion of said roll* producing and directing said energy to [at least one] *a sufficient number* of said transverse segments of said roll so that the nip pressure between said roll segment and the other said co-operating element will change in response to changes in said energy thereby effecting changes in said roll pressing operation; taking a [measurement] *sufficient number of measurements* of said physical property; generating [an] electrical [signal] *signals* proportional to said property measurement; taking said *signals* [signal] and using [it] *them* to control said changes in said energy so that said physical *transverse profile of said* property will be controlled by said changes in said roll pressing operation.

3. The method of claim [2] *1* wherein the said roll pressing operation and said desired property is influenced by the heat level of said operation in addition to the local nip pressure so that when additional amounts of said energy is directed at said roll the heat level of said segments will change in response to changes in said additional energy thereby effecting further changes in said roll pressing operation and allowing the average transverse value of said property to be controlled simultaneously with the said transverse profile of said property.

4. The method of claim [2] *1* wherein the said roll pressing operation and a property of said web material other than said property is influenced by the heat level of said operation in addition to the local nip pressure so that when additional amounts of said energy are directed at said roll the heat level of said segments will change in response to changes in said additional energy thereby effecting further changes in said roll pressing operation and allowing the average transverse value of said other property to be controlled simultaneously with the said transverse profile of said property.

9. The apparatus of claim [6] *17* further including means for protecting said magnetic field generating means.

12. An apparatus as claimed in claim [11] *14* wherein the generating means is slidably mounted on the mounting means for movement toward or away from the surface of the roll.

13. An apparatus as claimed in claim [11] *14* wherein the mounting means is fixed to the support means and the support means are moveably mounted for movement in a direction parallel to the axis of the roll.

14. An apparatus as claimed in claim [10] *17* including means [to sense values of a property of the paper sheet controlled by the nip pressure and means connected between the sensing means and the magnetic field generating means to operate the magnetic field generating means in accordance with the values sensed] *at a selected position along the length of one of the rolls and adjacent to the roll to affect only a portion of the length of the roll when the generating means is operated whereby to control only that portion of the length of the nip generally aligned with the affected portion of the roll, the locating means comprising supporting means adjacent the roll and over the length of the roll, mounting means provided for mounting the magnetic field generating means on the support means, said mounting means being slidably mounted on the support means for movement along the length of the roll.*

*17. An apparatus for treating a web of material comprising two co-operating rotating rolls forming a nip, means for passing said web of material through the nip, and which web of material is thereby subjected to a nip pressure, a plurality of means for selectively generating a magnetic field to heat and increase the diameter of at least a first on of said rolls, said generating means being divided into two rows adjacent each other and being located along selected positions adjacent the roll, the generating means in one row staggered with respect to the generating means in the other row, means for controlling each magnetic field generating means independently of the other means, such that when the generating means are operated, they control only that portion of the length of the nip generally aligned with the affected portion of the roll, first means to sense values of a first property of the web controlled by the nip pressure, means connected between the first sensing means and magnetic field generating means to operate the magnetic field generating means in accordance with the values of the first property sensed, second sensing means to detect values of a property controlled by the temperature of the web, and means connecting the second sensing means with means for heating all of the said first one of said rolls to control said heat sensitive property in accordance with the temperature property values sensed.*

*18. An apparatus for the calendering of a paper material to control a desired physical property of the paper material, comprising at least first and second calender rolls forming a nip therebetween, means for feeding said paper material* through said nip, at least one of said rolls being made of a material which will allow the local diameter of any transverse segments of said roll to change in dimension and thereby change the nip pressure associated with said segment when energy in the form of a magnetic field is directed at said segment, means for producing and directing said energy to at least one of said transverse segments of said rolls so that nip pressure between said roll segment and the other said roll will change in response to changes in said energy thereby effecting changes in said roll pressing operation, means for taking a measurement of said desired physical property, means for generating an electrical signal proportional to said property measurement, means for taking said signal and using it to control said changes in said energy so that said physical property will be controlled by said changes in said roll pressing operation, and means for influencing the heat level of said roll in addition to said magnetic field energy such that the heat level of said segments will change in response to changes in said additional energy thereby effecting further changes in said roll pressing operation and allowing an average transverse value of the property to be controlled simultaneously with the transverse profile of the property.

19. The apparatus of claim 18 wherein said apparatus includes a plurality of said transverse segments and a plurality of means for directing said energy at said segments and a means for generating a plurality of signals proportional to a plurality of measurements of said physical property so that the transverse profile of said physical property of said web can be controlled by said signals.

* * * * *